United States Patent [19]

Andersen

[11] 3,725,683

[45] Apr. 3, 1973

[54] DISCRETE AND INTEGRATED-TYPE CIRCUIT

[75] Inventor: Todd G. Andersen, Lombard, Ill.

[73] Assignee: Wescom, Inc., Downers Grove, Ill.

[22] Filed: Feb. 3, 1971

[21] Appl. No.: 112,345

[52] U.S. Cl.............307/305, 307/252 F, 317/235 R, 317/235 AB, 317/235 E, 317/235 Y

[51] Int. Cl................................................H01l 17/00

[58] Field of Search ......317/235; 307/305, 324, 313, 307/252 F, 252 G

[56] References Cited

UNITED STATES PATENTS

| | | | |
|---|---|---|---|
| 3,609,413 | 9/1971 | Lane et al | 317/235 |
| 3,390,306 | 6/1968 | White | 307/313 |
| 3,575,646 | 4/1971 | Karcher | 317/235 |

*Primary Examiner*—Jerry D. Craig
*Attorney*—Wolfe, Hubbard, Leydig, Voit & Osann

[57] ABSTRACT

A three terminal, four layer latching-type thyristor having its gate brought out from the layer or region adjacent its anode is characterized by having a holding current level which is substantially higher than its turn-on current level and is, therefore, especially well suited for end mark controlled switching systems.

18 Claims, 6 Drawing Figures

INVENTOR.
TODD G. ANDERSEN,
BY
Wolfe, Hubbard, Leydig, Voit & Osann
ATTORNEYS.

INVENTOR.
TODD G. ANDERSEN,
BY
Wolfe, Hubbard, Leydig, Voit & Osann
ATTORNEYS.

DISCRETE AND INTEGRATED-TYPE CIRCUIT

BACKGROUND OF THE INVENTION

During the course of the investigations leading up to the invention disclosed and claimed in the copending Bradbery et al. U.S. application Ser. No. 220,651 for End Mark Controlled Switching System and Matrix it become apparent that the known three terminal thyristors were at best marginally satisfactory for end mark controlled switching systems. The primary problem that was encountered is that the known thyristors have little, if any, differential between their turn on and holding current levels. Some of them have low turn-on and low holding current levels and are, therefore, readily "turned on" or switched into conduction but not so readily "turned-off" or switched out of conduction. Others have high turn-on and high holding current levels such that they are readily "turned-off" but not so readily "turned on."

As a matter of definition, as used herein, the turn-on or starting current level for a three terminal thyristor is the minimum anode current that is required to cause the thyristor to switch into conduction. In contrast, the holding current level is the minimum anode current that is required to latch or maintain the thyristor in its conductive state.

SUMMARY OF THE INVENTION

Accordingly, it is an object of the present invention to provide an improved three terminal thyristor for end mark controlled switching systems. A related object is to provide a three terminal thyristor having a substantial differential between its turn-on and holding current levels. An even more specific object is to provide a three terminal thyristor which has a holding current level which is substantially higher than its turn-on current level.

Another object of the present invention is to provide a thyristor of the foregoing type which has at least voice grade anode-cathode transmission characteristics when in its conductive state for analog signals within the frequency range normally encountered in telephony.

A further object of the present invention is to provide an integrated thyristor wherein provision is made to reduce the current losses to the substrate.

Still another object of the present invention is to provide a thyristor of the foregoing type which lends itself to integration with similar thyristors or other circuitry such that the component density per chip may be optimized to minimize the cost per component.

DETAILED DESCRIPTION OF THE ILLUSTRATED EMBODIMENTS

While the invention is described in detail hereinafter in connection with particular embodiments, it is to be understood that the intent is not to limit it to those embodiments. To the contrary, the intent is to cover all modifications, alternatives, and equivalents falling within the spirit and scope of the invention as defined by the appended claims.

Figure 1:
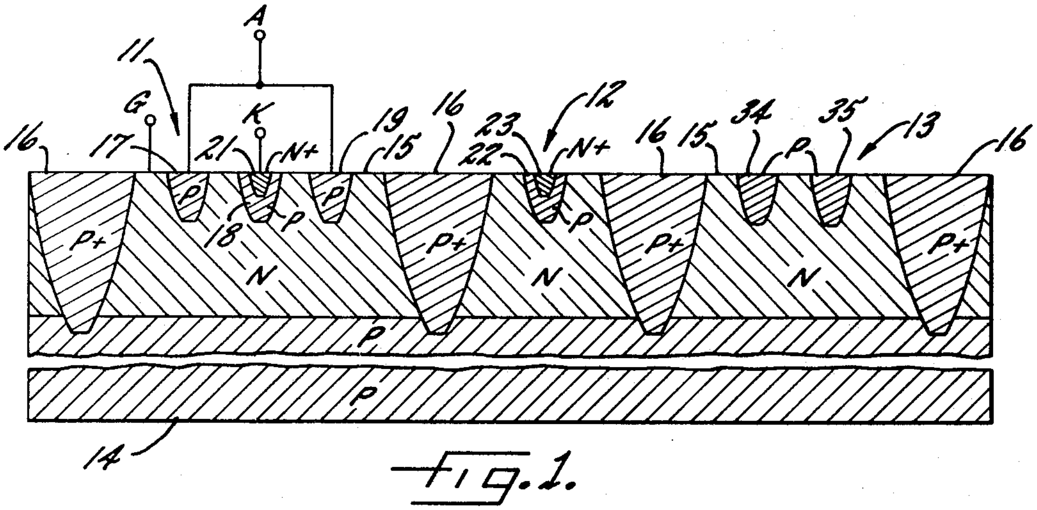
FIG. 1 is a vertical section taken through a simplified three terminal, four layer thyristor constructed in accordance with the present invention.
Figures 2, 3:
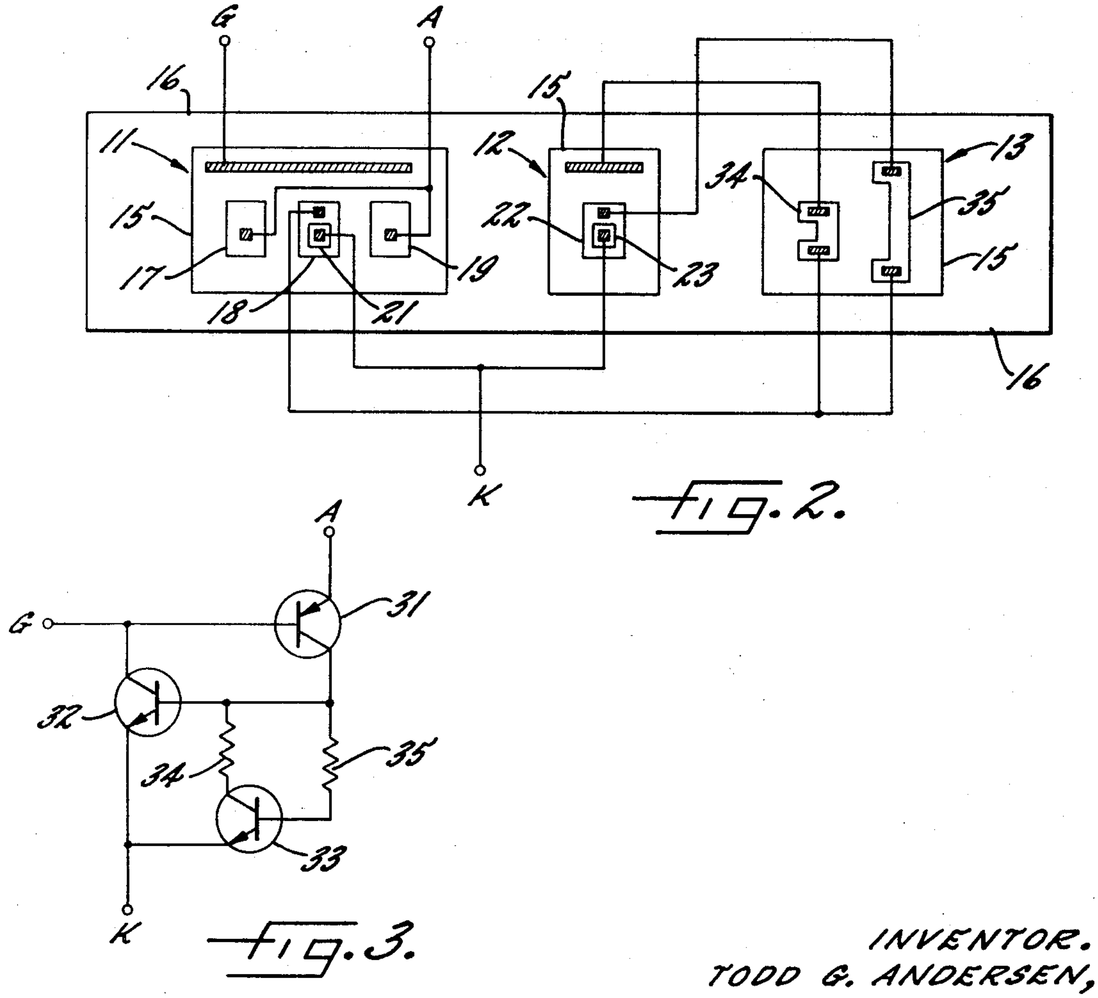
FIG. 2 is a plan view of the thyristor shown in FIG. 1 wherein external leads have been substituted for the metallized deposits normally used to better illustrate the connections between the various members of the thyristor.
FIG. 3 is a schematic diagram of the discrete component equivalent of the thyristor shown in FIGS. 1 and 2.

Referring with that in mind to FIGS. 1 and 2, it will be seen that a representative three terminal, four layer thyristor embodying the present invention comprises three isolation islands 11, 12 and 13. The isolation islands or regions share a common substrate 14 and epitaxial layer 15, but are electrically isolated from one another by an isolation diffusion or deposit 16 which separately encompasses each of them and which extends vertically from the surface of the epitaxial layer 15 into the substrate 14. Normally, of course, the substrate 14 is of significantly greater depth than the epitaxial layer 15.

In the illustrated embodiment, the substrate 14 is indicated as being a P-type semiconductor material such as may be formed by doping with acceptor impurities. The epitaxial layer 15, on the other hand, is indicated as being a N-type semiconductor material which is ground on the substrate and doped with donor impurities. Accordingly, in keeping with accepted practices, the isolation diffusion 16 is doped to be a P-type semiconductor material and, during operation, the substrate 14 is held (by means not shown) at a potential which is negative relative to the potentials of the isolation islands 11—13. There are, therefore, two back biased, back-to-back, isolation island-to-substrate PN junctions separating and electrically isolating each of the isolation islands from the others. Generally, as indicated by the P+ notation, the isolation diffusion 16 is more heavily doped (i.e., has a higher concentration of acceptor atoms) than the substrate 14 in order to prevent the depletion regions that are associated with the back biased PN junctions from extending into, and potentially through, the isolation diffusion.

Focusing for the moment on the isolation island 11, it will be seen that it generally corresponds to a known three terminal PNPN thyristor of the type that is sometimes referred to as a programmable unijunction transistor (PUT) or complementary silicon controlled rectifier (SCR). Specifically, the isolation island 11 comprises three laterally spaced diffusions or deposits 17–19 of P-type semiconductor material which penetrate only partially through the epitaxial layer 15, together with a diffusion or deposit of heavily doped N+ semiconductor material which overlies the centrally located P-type diffusion 18 and which penetrates only partially therethrough. Commonly, the P-type diffusions 17–19 are referred to as base diffusions, whereas the N+-type diffusion 21 is referred to as an emitter diffusion. The outer two P-type diffusions 17 and 19 are electrically interconnected and brought out as the anode A of the thyristor, the N-type epitaxial layer 15 (i.e., the region adjacent the anode is brought out as the gate G), and the N+ diffusion 21 is brought out as the cathode K. Hence, the four layers or PNPN characteristic of the thyristor can be traced from the P-type anode regions 17 and 19, to the N-type epitaxial gate region 15, next to the P-type region 18, and finally to the N+-type cathode region 21.

As viewed from an equivalent discrete component standpoint, the isolation island 11 comprises a pair of complementary transistors 31 and 32 (FIG. 3) which, in this instance, are PNP and NPN-types, respectively. Each of the transistors 31 and 32 has its base connected to the collector of the other such that there is a regenerative action between them. In particular, the base of the PNP transistor 31 and the collector of the NPN transistor 32 are both defined by the N-type epitaxial layer 15, whereas the collector of the PNP transistor and the base of the NPN transistor are both defined by the P-type diffusion 18. The emitters of the PNP and NPN transistors 31 and 32 are, in turn, respectively defined by the P-type diffusions 17, 19 and the N+-type diffusion 21.

The range for effective control over the thyristor is limited to the range between its turn-on and holding current levels. When the anode current is below the turn-on current level (i.e., the level required to drive the transistors 31 and 32 into conduction so as to complete a circuit between the anode A and the cathode K) or above the holding current level (the level required to drive the transistors 31 and 32 into saturation) it may be varied without tending to cause any change in the state of conduction of the thyristor. When, however, the anode current is varied within control range, the variation causes a corresponding change in the conductivity of the thyristor and initiates the regenerative action which tends to cause the anode current to further change in the same direction as the original variation. For example, say the anode current is increased in a manner tending to increase the conductivity of the transistor 31. In that event, increased base-emitter drive current is supplied for the transistor 32 and its conductivity, therefore, increases such that it attempts to draw increased current through the base-emitter junction of the transistor 31 to thereby further increase its conductivity, and so forth in a regenerative manner, until the transistors 31 and 32 are driven into saturation. On the other hand, when the anode current is decreased in a manner tending to decrease the conductivity of the transistor 31, the base-emitter drive current for the transistor 32 drops with the result that its conductivity falls off to thereby tend to decrease the current drawn through the base-emitter junction of the transistor 31 to further decrease its conductivity, and so on, until the transistors 31 and 32 are switched out of conduction.

As previously mentioned, the primary problem with the prior art thyristors is that they have a very small differential between their turn-on and holding current levels. For example, a typical thyristor such as comprised by the isolation island 11 alone, has calculated turn-on and holding current levels of about 1 microampere and 13 microamperes, respectively. Thus, in accordance with one of the important aspects of the present invention, provision is made for substantially increasing the differential. To that end, there is a switch-type bypass means which is actuated as the thyristor is turned on or switched into conduction to provide an alternative path for anode current flow. Because of the switch-type action of the bypass means, the impedance of the alternative path drops from a relatively high value at turn-on to a significantly lower value as the conductivity of the thyristor increases. The bypass means, therefore, has a much greater effect on the holding current level for the thyristor than on its turn-on current level such that the differential between them is substantially increased. In essence, the result is a new three terminal latching-type thyristor which may be referred to as a "Trigger Point Adjustable Diode" or "TAD."

In the illustrated embodiment, to form the bypass means, the second isolation island 12 comprises a P-type base diffusion or deposit 22 which is sandwiched between the N-type epitaxial layer 15 and a N+-type emitter diffusion or deposit 23, and the third isolation island 13 comprises a pair of laterally spaced P-type base diffusions or deposits 34 and 35. Accordingly, it will be seen that there is the equivalent of another NPN transistor 33 having its collector, base, and emitter respectively defined by the epitaxial layer 15, the P-type diffusion 22, and the N+-type diffusion 23 of the second isolation island 12 and a pair of resistors 34 and 35 which are defined by the correspondingly numbered diffusions of the third isolation island 13. The resistors 34 and 35 respectively connect the collector and base of the transistor 33 to the P-type diffusion 18 which, as will be recalled, defines both the collector of the transistor 31 and the base of the transistor 32. The emitter of the transistor 33 is, in turn, directly connected to the N+-type diffusion 21 which, as previously mentioned, defines the emitter of the transistor 32. In other words, the base-emitter and collector-emitter circuits of the transistor 33 are both connected between the collector of the transistor 31 and the cathode K of the thyristor in parallel with the base-emitter junction of the transistor 32.

Due to the presence of the resistor 35, the anode current drawn through the collector-emitter circuit of the transistor 31 divides so that only a relatively small portion of it is supplied as base-emitter drive current for the transistor 33. Hence, at turn-on of the thyristor, the collector-emitter circuit of the transistor 33 constitutes a relatively high impedance by pass path around the base-emitter junction of the transistor 32 and, therefore, diverts very little current therefrom so as to have correspondingly little effect on the anode current required to affect turn-on. However, as the anode current is increased towards the holding level, there is increased drive current for the transistor 33 which causes the d.c. impedance of its collector-emitter circuit to drop such that an increased amount of current is bypassed therethrough. Consequently, the transistor 33 has a very substantial effect on the amount of anode current that is required to drive the transistor 32 into saturation, which will be recalled as being a prerequisite to latching or holding the thyristor in its conductive state.

As will be appreciated, the turn-on and holding current characteristics for the thyristor may be adjusted by selecting different values for the resistor 35. The resistor 34 is a current limiting resistor which may be eliminated if desired. If the resistor 34 is employed, its value may be selected in conjunction with that of the resistor 35 to permit saturation of the transistor 33. In that event, the value selected for the resistor 34 will have a modifying affect on the holding current level without materially affecting the turn-on current level. By way of comparison with the aforementioned turn-on and holding current levels for the prior art thyristor, it is noted that calculated turn-on and holding current levels for a typical thyristor embodying the present invention, with the resistor 34 being assigned a value of zero and the resistor 35 being assigned a value of 10K, are approximately 45 microamperes and 230 microamperes, respectively. It is also noteworthy that the bypass means that have been provided tend to enhance the turn-off characteristics of the thyristor. Specifically, under turn-off conditions, the collector-emitter circuit of the transistor 33 provides a low impedance discharge path for the base storage current of the transistor 32, thereby ensuring that the conductivity of the transistor 32 rapidly increases as the anode current drops below the holding current level. By virtue of the aforementioned regenerative action, the rapid response of the transistor 32 tends to provide sharper or quicker turn-off of the thyristor.

Figure 4:
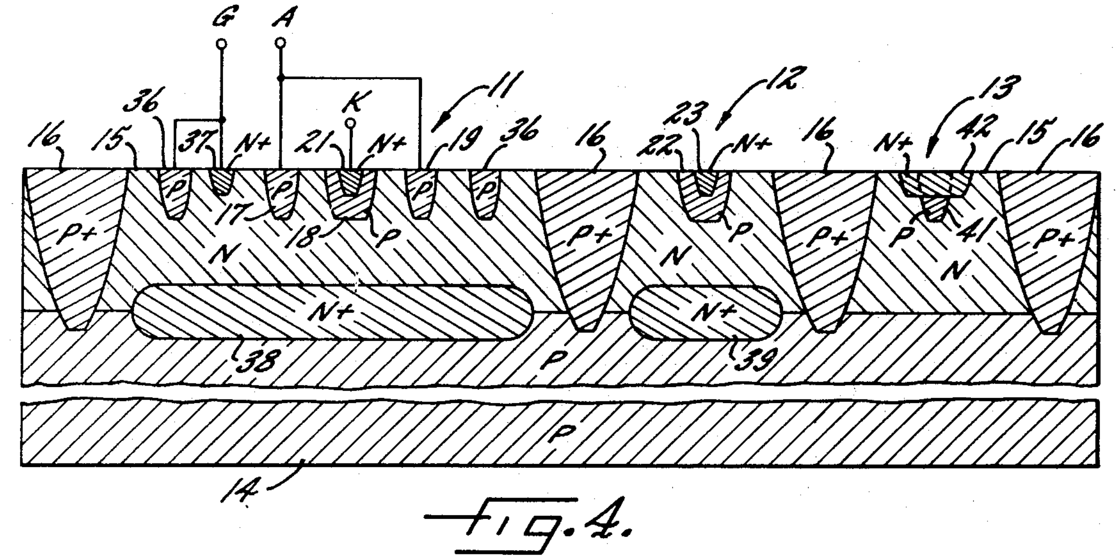
FIG. 4 is a vertical section taken through a modified three terminal, four layer thyristor constructed in accordance with the present invention.
Figures 5, 6:
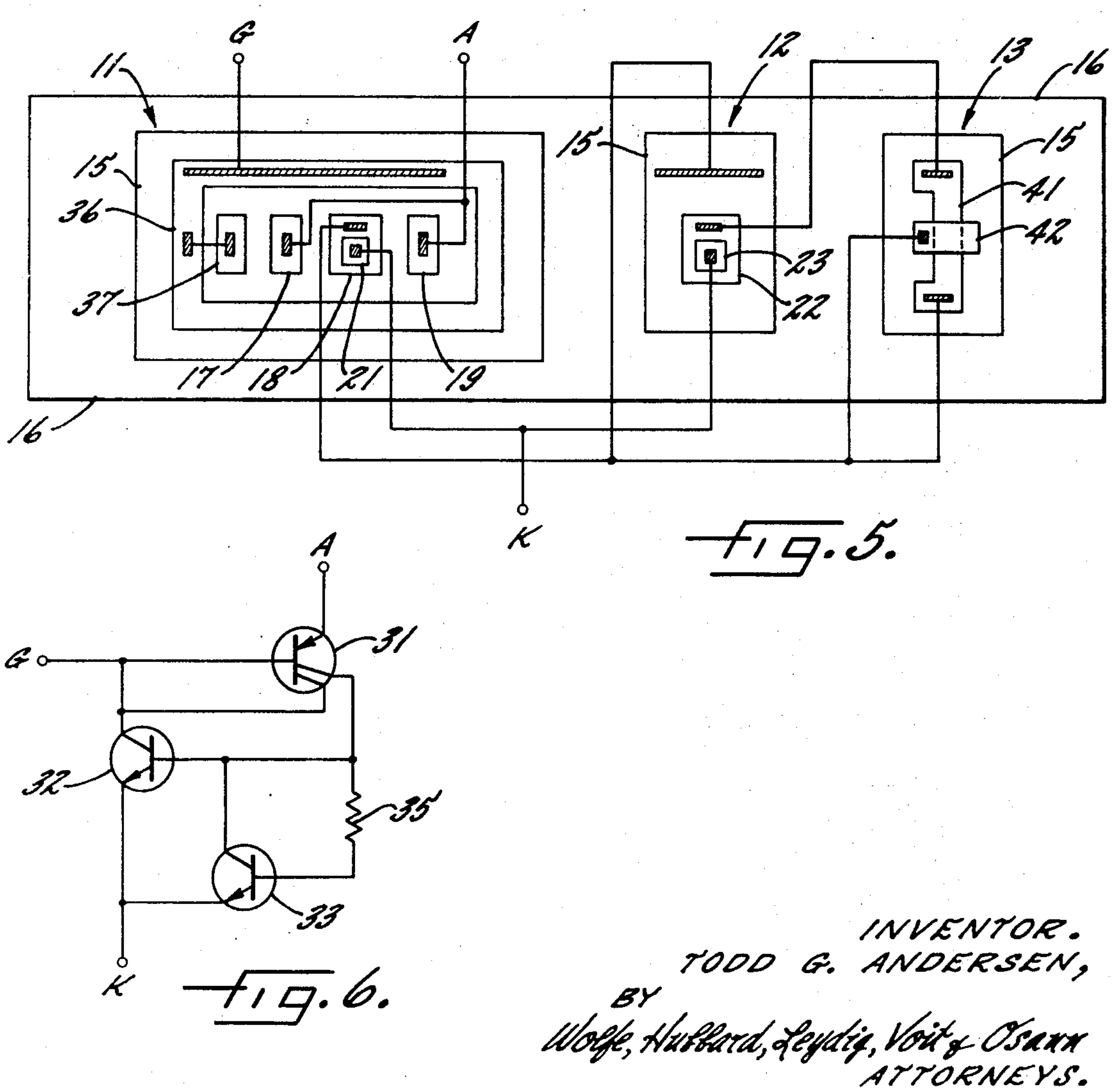
FIG. 5 is a plan view of the thyristor shown in FIG. 4 and again includes external leads rather than the conventional metallized deposits to better illustrate the connections between the various members of the thyristor.
FIG. 6 is a schematic diagram generally corresponding to the thyristor shown in FIGS. 4 and 5.

As illustrated by FIGS. 4-6, various modifications may be made to further improve the characteristics of the thyristor.

For example, there are inherent spurious or undesired paths for current flow from the isolation island 11 to the substrate 14, including parasitic PNP transistors which have their emitters defined by the P-type diffusions 17 and 19, their bases defined by the N-type epitaxial layer 15, and their collectors defined by the P-type substrate 14. D.C. current losses to the substrate are, of course, undesirable in that they reduce the efficiency in the use of the anode current supplied to the thyristor and increase the power that must be dissipated by the substrate. Even more importantly, when the thyristor is to be used for direct transmission of analog signals via its anode-cathode circuit as discussed in more detail with specific reference to the TAD in the aforementioned Bradbery et al. application, a.c. current losses to the substrate represent an undesirable attenuation of the analog signals levels. To reduce the current losses to the substrate and improve the frequency response characteristics, either the known dielectric isolation technique or the known beam lead isolation technique may be used. Alternatively, a substantial the reduction of current losses may be achieved more economically in accordance with one of the detailed aspects of the present invention by encompassing the P-type diffusions 17, 19 within a further P-type base diffusion or deposit 36 which is connected to the gate G of the thyristor. As will be appreciated, the diffusion 36 essentially comprises a second collector for the transistor 31 in that it collects a substantial portion of the current tending to flow from the diffusions 17, 19 (i.e., the emitter of the transistor 31) toward the substrate 14 for return to the junction between the base of the transistor 31 and the collector of the transistor 32.

Further, in keeping with accepted practices, a N+-type diffusion or deposit 37 may be provided at the point of contact between the gate G and the epitaxial layer 15 so as to reduce the ohmic contact resistance associated with the point of contact between the gate lead and the N-type epitaxial layer 15. Likewise, the isolation islands 11 and 12 may include respective N+-type buried layers 38 and 39 which are sandwiched between the epitaxial layer 15 and the substrate 14 to reduce the series collector resistances of the NPN transistors 32 and 33 comprised by the isolation islands 11 and 12. The buried layers 38 and 39 may be obtained with conventional manufacturing processes either by diffusing the N+layers into the substrate 14 before the N-type epitaxial layer 15 is grown or by selectively growing the N+-type layers through the use of masked epitaxial techniques.

Finally, to achieve closer control over the turn-on and holding current levels of the thyristor, provision may be made to reduce or substantially eliminate the dependence of the collector current drawn by the transistor 33 on its beta versus base current characteristics. To that end, the resistor 35 (FIGS. 3 and 6) may be a "pinched base" type. In that event, the resistor 35 is preferably included within the same isolation island 12 as the transistor 33, although it has here been shown in the interest of clarity as being comprised by the separate isolation section 13. The pinched base resistor is formed in the usual manner by "pinching-off" a portion of a P-type diffusion 41 with an overlying N+-type base diffusion or deposit 42. The N+-type emitter diffusion 42 penetrates the P-type base diffusion 41 to a predetermined depth so as to force the current drawn through the P-type diffusion 41 into a relatively narrow channel.

In the drawings the invention has been described both in connection with an integrated circuit (e.g., FIGS. 1 and 2, which constitutes the preferred form of the invention) and in connection with a circuit illustrating discrete elements (for example, FIG. 3). It will be understood, however, that the circuit illustrating the discrete elements in fact constitutes a schematic diagram of integrated circuit and thus assists in understanding the operation of the integrated circuit. As a further aid in understanding the illustrated circuit, it may be considered in terms of transistors each having an input circuit and an output circuit and with the input and output circuits being related in a particular fashion. Thus, referring to FIG. 3 first and second transistors indicated at 31, 32, each have an input circuit which includes the base and an output circuit which includes the emitter-collector. Thus it will be seen in FIG. 3 that the output circuit of the first transistor 31 is connected in series with the input circuit of the second transistor 32. The input circuit of the first transistor is similarly connected to the output circuit of the second, which inherently provides regenerative action. The gate terminal G is connected to the input circuit of the transistor 31, although it could just as readily be connected to the input circuit of the transistor 32 to initiate flow of low current between the anode and the cathode terminals A, K.

The auxiliary or switching transistor 33 has its output (emitter-collector) circuit connected in parallel with the input (base-emitter) circuit of the transistor 32 in current by-passing relationship while its input (base) circuit is coupled to the output circuit of the first transistor 31. A resistor indicated at 35 is interposed in the coupled circuit. The value of this resistor is such that the auxiliary transistor is substantially open-circuited under initial conditions of low turn-on current, that is, when the transistors 31–32 just start to conduct. However, as the transistors 31, 32 rapidly but progressively become more fully conductive (due to the regenerative action), a greater amount of current flows via the resistor 35 through the input or base circuit of the transistor 33 which then acts to by-pass a progressively greater amount of current around the input circuit of the transistor 32. The effect of this by-passing, progressively with increased load current, is to tend to keep the portion of the load current which flows through the transistor 32 at a low level, a level which will marginally sustain conduction. This tends to defeat the regenerative action so that much more current must flow through the load terminals A, K in order to keep the transistors 31, 32 self-conducting than would otherwise suffice.

Transistors 31, 32, taken together, have the characteristics of a thyristor, or SCR, in which the holding current is only slightly greater than the turn-on current. In the case of a thyristor conduction tends to "hang on" until the applied voltage is substantially reduced or until the external impedance is substantially increased. In the present circuit by contrast, the holding current required to maintain conduction, being many times the turn-on current, is so great that even a relatively small reduction in voltage, or increase in external impedance, results in turn-off of the circuit, which is an important attribute when the circuit is employed for matrix switching, for example, as described in the copending application mentioned above.

It will be understood that the term "transistor" as used herein is intended to denote a solid state device having an input circuit and an output circuit in which a flow of current in the input circuit is effective to produce an amplified flow of current in the output circuit regardless of whether the device is in discrete or integrated form.

CONCLUSION

In view of the foregoing, it will now be appreciated that the present invention provides a three terminal, four layer latching device of the thyristor type which is characterized by having a substantial differential between its turn-on and holding current levels. It will be further understood that provision may be economically included within the thyristor to reduce the d.c. and a.c. current losses to the substrate so as to improve the efficiency of the thyristor and its analog signal transmission characteristics. While the TAD thyristor provided by the present invention has been shown and discussed primarily with respect to its monolithic integrated circuit form, it is to be understood that it may take other forms, such as being embodied in a thin film integrated circuit or even, in some instances, in its discrete component equivalent circuit form. Moreover, certain aspects of the present invention, such as the provision made to increase the differential between the turn-on and holding current levels will be recognized as applying equally well to two terminal PNPN diodes as to the three terminal thyristors which have been discussed.

I claim as my invention:

1. A latching-type device having first and second terminals and being characterized by a substantial differential between its turn-on and holding current levels, said device comprising the combination of a pair of regeneratively connected transistors coupled between said terminals, and switch means connected between one of said transistors and said second terminal for providing a path to bypass current flowing from said first terminal and through said one transistor around the other of said transistors to said second terminal, said switch means having means including a resistor responsive to the current level so as to provide a relatively high impedance bypass path at said turn-on current level and a relatively low impedance bypass path at said holding current level.

2. The latching-type device of claim 1 comprised by a single integrated circuit which includes separation isolation islands for said switch means and said transistors, respectively.

3. The latching-type device of claim 2 wherein said transistors are complementary transistors each of which includes a base, collector, and emitter, each of said transistors having its base connected to the collector of the other and its emitter connected to a respective one of said terminals.

4. The latching-type device of claim 3 wherein the isolation island for said transistors comprises a layer of N-type semiconductor material, three laterally spaced deposits of P-type semiconductor material overlying and extending a predetermined distance into said layer of N-type semiconductor material, and a deposit of N+-type semiconductor material overlying and extending a predetermined distance into the centrally located one of said P-type deposits, whereby the outer two of said P-type deposits define the emitter of a PNP transistor, the N+-type deposit defines the emitter of a NPN transistor, the centrally located P-type deposit defines the collector of the PNP transistor and the base of the NPN transistor, and the N-type layer defines the base of the PNP transistor and the collector of the NPN transistor.

5. The latching-type device of claim 4 further including a further deposit of P-type semiconductor material encompassing the laterally spaced P-type deposits and being connected to the N-type layer for collecting spurious current flow from the outer two of the P-type deposits and returning it to the base and collector of the PNP and NPN transistors, respectively.

6. The latching-type device of claim 5 wherein said N-type layer is an epitaxial layer grown on a substrate of P-type semiconductor material, and said deposits are diffusions.

7. A semiconductor latching-type device having anode, cathode and gate terminals and being characterized by having a relatively low anode current turn-on level and a relatively high anode current holding level, said device comprising the combination of a pair of regeneratively connected complementary transistors coupled between said anode and cathode terminals, and bypass means connected between one of said transistors and said cathode terminal for providing a path to bypass anode current around the other of said transistors, said bypass means having means including a resistor responsive to the level of said anode current so that said path has an impedance which drops from a relatively high level to a relatively low level as said anode current increases from said turn-on level to said holding current level.

8. The latching-type device of claim 7 wherein one of said transistors is a PNP-type and the other is a NPN-type, each of said transistors includes a base, emitter and collector, the base of each transistor is connected to the collector of the other, and the emitters of the PNP and NPN transistors are respectively connected to said anode and cathode, said integrated circuit further including means interposed between said transistors and said bypass means for electrically isolating them from each other.

9. The latching-type device of claim 8 wherein said bypass means includes another NPN transistor having a base, collector and emitter, said other NPN transistor having its base and collector connected to the collector of said PNP transistor and its emitter connected to the emitter of the first mentioned NPN transistor whereby the base-emitter and collector-emitter circuits of said other NPN transistor are in parallel with the base-emitter circuit of said first NPN transistor, and further including a resistor connected in series with the base of said other NPN transistor so that the collector-emitter circuit of said other NPN transistor comprises a relatively high impedance bypass path when said anode current is at said turn-on level and a relatively low impedance bypass path when said anode current is at said holding level.

10. The latching-type device of claim 9 wherein said PNP transistor and said first NPN transistor are defined by a layer of N-type semiconductor material, three laterally spaced deposits of P-type semiconductor material overlying said layer, and a deposit of N+-type semiconductor material overlying the middle one of said P-type deposits, and further including another deposit of P-type semiconductor material overlying said layer and encompassing said laterally spaced P-type deposits to define an additional collector for said PNP transistor.

11. The latching-type device of claim 10 wherein said other deposit of P-type semiconductor material is electrically connected to said N-type layer.

12. The latching-type device of claim 9 wherein said resistor is a pinched base resistor whereby the amount of current bypassed through the collector-emitter circuit of said other NPN transistor is substantially independent of its beta versus base current characteristics.

13. An integrated semiconductor thyristor having anode, cathode and gate terminals, said thyristor comprising a first isolation island including a pair of complementary, regeneratively connected transistors extending between said anode and cathode terminals and having a common connection to said gate terminal, and means for providing a path to bypass current flowing from said anode terminal and through one of said transistors around the other of said transistors to said cathode terminal, said means including a second isolation island defining a further transistor and means including a resistor for externally coupling said further transistor to said complementary transistors, whereby said bypass path has an impedance which decreases from a relatively high level to a relatively low level as said current flow increases such that said thyristor has a turn-on current level and a higher holding current level separated by a substantial differential.

14. The thyristor of claim 13 wherein said first isolation island comprises a first layer of N-type semiconductor material supporting laterally spaced deposits of P-type semiconductor material and a first deposit of N+-type semiconductor material overlying one of said P-type deposits, whereby said complementary transistors are a PNP transistor and a NPN transistor with the first N+-type deposit defining an emitter of said NPN transistor, said one P-type deposit defining a base of said NPN transistor and a collector of said PNP transistor, the first N-type layer defining a collector of said NPN transistor and a base of said PNP transistor, and another of said P-type deposits defining an emitter of said PNP transistor; said anode, cathode, and gate terminals are respectively brought out from said other P-type deposit, said first N+-type deposit and said first N-type layer; said second isolation island includes a second layer of N-type semiconductor material supporting a further deposit of P-type semiconductor material underlying a second deposit of N+-type semiconductor material, whereby said further transistor is a NPN transistor having a base, collector and emitter respectively defined by said further P-type deposit, said second N-type layer and said second N+-type deposit; said further P-type deposit and said second N-type layer are externally coupled to said one P-type deposit; and said second N+-type deposit is externally coupled to said first N+-type deposit; said thyristor further including a predetermined resistance interposed between said further P-type deposit and said one P-type deposit, whereby the conductivity of said further NPN transistor is controlled to increase as said current flow increases from said turn-on current level to said holding current level to thereby decrease the impedance of said bypass path.

15. The thyristor of claim 14 wherein said resistance is provided by a pinched base resistor, whereby the impedance of said bypass path is substantially independent of the beta versus base current characteristics of said further NPN transistor.

16. A latching type solid state assembly having anode, cathode and gate terminals comprising in combination first and second transistors connected between said terminals with the output circuit of one transistor being connected in series with the input circuit of the other so as to provide regenerative action, the gate terminal being connected to one of the transistor input circuits for supplying gate current to such input circuit to initiate flow of load current between the anode and cathode terminals at a low turn-on level, an auxiliary transistor having its output circuit connected in parallel with the input circuit of the second transistor in current by-passing relationship and having its input circuit coupled to the output circuit of the first transistor, and a resistor interposed in the coupled circuit, the value of the resistor being such that the auxiliary transistor is substantially open circuited in the face of low turn-on current but progressively conducting at higher values of load current so as to bypass a progressively greater amount of current around the input circuit of the second transistor so that the holding load current required to hold the first and second transistors in conduction in absence of gate current is many times greater than the holding load current which would be required in the absence of the auxiliary transistor to provide a substantial differential between the turn-on and holding current levels thereby to facilitate turn-off.

17. The latching type solid state assembly of claim 16 in which all three of the transistors are included in a single integrated circuit.

18. The latching type solid state assembly of claim 16 wherein the first and second transistors are complementary with each having its base connected to the collector of the other and its emitter connected to a respective one of the terminals and in which the resistor is connected to the collector of the first transistor.

* * * * *